United States Patent [19]

Pan et al.

[11] Patent Number: 5,011,580
[45] Date of Patent: Apr. 30, 1991

[54] METHOD OF REWORKING AN ELECTRICAL MULTILAYER INTERCONNECT

[75] Inventors: Ju-Don T. Pan, Cupertino, Calif.; John W. Curry, II, Austin, Tex.; Laurence D. Schultz, Boise, Id.

[73] Assignee: Microelectronics and Computer Technology Corporation, Austin, Tex.

[21] Appl. No.: 543,317

[22] Filed: Jun. 25, 1990

Related U.S. Application Data

[63] Continuation-in-part of Ser. No. 426,619, Oct. 24, 1989.

[51] Int. Cl.[5] ............................................. C25D 5/02
[52] U.S. Cl. .................................. 204/15; 204/38.1; 204/38.4
[58] Field of Search .................. 204/15, 38.1, 38.4, 204/40

[56] References Cited

U.S. PATENT DOCUMENTS

| 3,745,094 | 7/1973 | Greene | 204/15 |
| 3,791,858 | 2/1974 | McPherson et al. | 117/241 |
| 4,082,591 | 4/1978 | Morisaki et al. | 156/150 |
| 4,159,222 | 6/1979 | Lebow et al. | 156/632 |
| 4,190,474 | 2/1980 | Berdan et al. | 156/151 |
| 4,233,344 | 11/1980 | Brasch | 427/304 |
| 4,306,925 | 12/1981 | Lebow et al. | 156/150 |
| 4,409,037 | 10/1983 | Landau | 148/1.64 R |
| 4,810,332 | 3/1989 | Pan | 204/15 |

OTHER PUBLICATIONS

Pan et al., "A Planar Approach to High Density Copper-Polyimide Interconnect Fabrication," Proceedings of the Technical Conference-Eighth Annual International Electronics Packaging Conference, Dallax, Tex., Nov. 7, 1988.

Jensen et al., "Copper/Polyimide Materials for High Performance Packaging," IEEE Transactions on Components, Hybrids, and Manufacturing Technology, vol. CHMT-7, No. 4, Dec. 1984, pp. 384-393.

Taylor et al., "The Wafer Transmission Module-Wafer Scale Integrated Packaging", IEEE 1985 Custom Integrated Circuits Conference, 1985, pp. 55-58.

Lebow, "High Density/High Speed Multi-Chip Packaging", Proceedings of the Technical Conference, Sixth Annual International Electronics Packaging Conference, Nov., 1986, pp. 417-423.

Primary Examiner—T. M. Tufariello
Attorney, Agent, or Firm—David M. Sigmond

[57] ABSTRACT

A method of reworking an electrical multilayer interconnect in which the electrical lines can be protected by an overcoat. The method includes removing a defective metallization layer from the top of an interconnect substrate, depositing an electrically conductive layer on the substrate, forming a base plating mask on the electrically conductive layer, plating a copper base into an opening in the base plating mask onto the electrically conductive layer, stripping the base plating mask, forming a pillar plating mask on top of the copper base, plating an electrically conductive metal pillar into an opening in the pillar plating mask onto the top of the copper base, stripping the plating mask, and stripping the electrically conductive layer below the stripped base plating mask. Additionally, a protective overcoat layer can be deposited on the exposed copper surfaces.

24 Claims, 6 Drawing Sheets

METHOD OF REWORKING AN ELECTRICAL MULTILAYER INTERCONNECT

CROSS-REFERENCE TO RELATED APPLICATIONS

This application is a continuation-in-part of U.S. Ser. No. 07/426,619, filed Oct. 24, 1989, and entitled "Method of Making an Electrical Multilayer Interconnect."

BACKGROUND OF THE INVENTION

Advances in integrated circuits used in high performance systems have created a demand for higher density electrical interconnections to accommodate large numbers of inputs and outputs. Methods of manufacturing high density interconnects are known to those having skill in the art, as described in U.S. Pat. No. 4,810,332 which issued Mar. 7, 1989 and in Jensen et al., "Copper/Polyimide Materials for High Performance Packaging, IEEE Transactions on Components, Hybrids, and Mfg. Tech., vol. CHMT-7 #4, pp. 383-393 (December, 1984). Fabrication of such high density interconnects will invariably include a certain percentage of defective units, for instance from shortcircuited connections or from electrical openings. These defects are usually detected during manufacturing by mechanical, optical, or voltage contrast electron beam testing. Various options are available to rework defective interconnects. A short-circuit could be severed by a laser beam or an ion beam. An open line could be closed by laser deposition, laser chemical vapor deposition, chemical vapor deposition, or ink jet metal deposition.

Copper is the preferred conductor for such high density multilayer interconnects. One drawback of copper is that it is very subject to corrosion and oxidation. To fabricate and rework reliable multilayer copper interconnects, the copper can be protected by other materials.

SUMMARY OF THE INVENTION

The present invention is directed to an easy and economical method to rework an electrical multilayer interconnect having high density electrically conductive lines in a multilayer interconnect system in which the conductive lines can be protected by a protective coating.

One feature of the present invention of reworking an electrical multilayer interconnect is removing a defective metallization layer from the top of an interconnect substrate, depositing an electrically conductive layer on the substrate, forming a base plating mask on the electrically conductive layer, plating a copper base into an opening in the base plating mask onto the electrically conductive layer, stripping the base plating mask, forming a pillar plating mask on top of the copper base, plating an electrically conductive metal pillar into an opening in the pillar plating mask onto the top of the copper base, stripping the plating mask, and stripping the electrically conductive layer below the stripped base plating mask.

Another feature of the present invention is wherein the defective metallization layer is removed by uniform and non-selective polishing.

Yet a further feature of the present invention is wherein the polishing is done by a rotating pad with a slurry.

A further feature of the present invention is wherein the electrically conductive layer is a metal.

Still a further feature of the present invention is wherein the electrically conductive layer is electrolessly deposited.

Yet a further feature of the present invention is wherein the electrically conductive layer is sputter deposited.

A still further feature of the present invention is wherein the electrically conductive pillar is plated by electroless deposition.

Yet a further feature of the present invention is wherein the electrically conductive pillar is plated by electroplating.

Still a further feature of the present invention is wherein the electrically conductive metal pillar is copper, nickel, or a nickel alloy.

A still further feature of the present invention is wherein the exposed surfaces of the copper base and electrically conductive metal pillar are protected by depositing an overcoat layer.

A further feature of the present invention is wherein the overcoat layer is a chemically inert material, such as nickel, chromium, or a nickel alloy.

A still further feature of the present invention is wherein the overcoat layer is electrolessly deposited nickel.

Further objects, features and advantages will be apparent from the following description of presently preferred embodiments of the invention, given for the purpose of disclosure and taken in conjunction with the accompanying drawings.

DETAILED DESCRIPTION OF PREFERRED EMBODIMENTS

Figure 1:
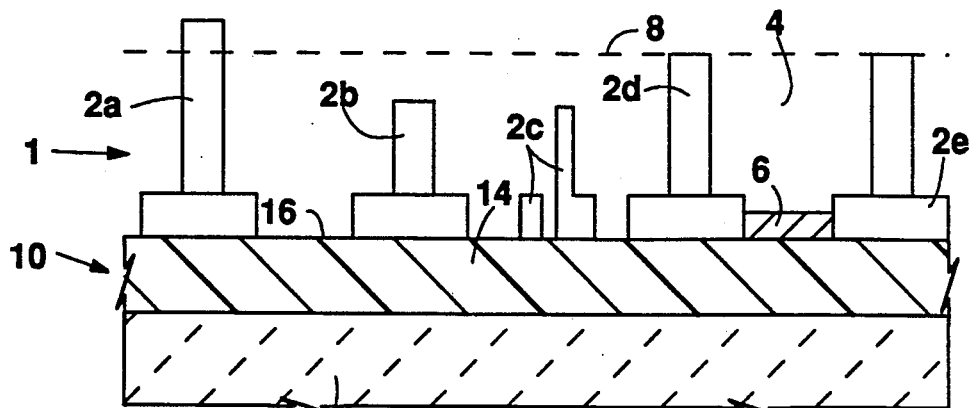
FIGS. 1-15 are fragmentary elevational views in cross-section illustrating a first embodiment of a method of reworking an electrical multilayer interconnect in accordance with the present invention, illustrating successive stages in the manufacturing process.

The present invention for reworking an electrical multilayer interconnect is now described. Referring now to FIG. 1, the reference numeral 10 generally indicates any suitable substrate. Preferably the substrate 10 includes a ceramic base 12, such as alumina ceramic or glass ceramic covered with a polyimide layer 14 having a polished surface 16. The polyimide layer 14 may have any suitable thickness, such as 10 $\mu$m. The base material 12 may be of other suitable materials, such as silicon or various metallic materials. It is to be understood that the present invention applies to substrates with additional metallization layers between defective metallization layer 1 and base 12. For instance, the present invention can be used to rework the upper layer of a four-layer electrical interconnect while leaving the underlying three layers undisturbed.

Defective metallization layer 1 is shown consisting of defective metal segments 2a, 2b, 2c, 2d and 2e enclosed by polyimide layer 4. Several defects exist: segment 2a is too high, segment 2b is too low, segment 2c has an electrical opening, and segments 2d and 2e are short-circuited together by metal fragment 6. Polyimide top surface 8 is non-planar due to segment 2a. The first step of the present invention requires the removal of defective metallization layer 1. In the preferred embodiment a uniform and non-selective polishing process is used with a rotating pad (not shown) to grind away defective layer 1. A suitable pad can be composed of fabric impregnated with polyurethane. For instance, a Shore D-82 hard pad will remove a wide variety of conductive metals used in interconnects, such as copper, aluminum, nickel, and tungsten. However, if the particular metal used does not require a relatively hard pad then a soft pad may be advantageous since a more uniform removal will result. Selection of the best pad depends on the materials to be polished; tungsten, for instance, will require a relatively hard pad. A slurry specific to the type of metal in layer 1 can be dispensed onto the rotating pad to assist with the polishing. For copper, a preferred slurry is alumina grit wherein alumina particles between 0.5 $\mu$m–1 $\mu$m are suspended in solution. Slurries used for other metals include silicon carbide and diamond paste.

Figure 2:
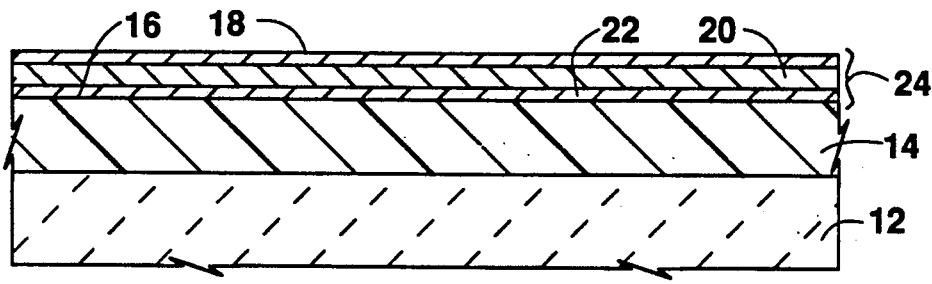

Referring now to FIG. 2, the defective metallization layer 1 has been removed and in accordance with the present invention the substrate 10 will be reworked by fabricating a new layer to replace the removed layer. An electrically conductive layer 24 is deposited on substrate 10. For instance layer 24 can consist of layers 18, 20 and 22 deposited on the surface 16 of the substrate 10. Preferably a sputter deposited titanium layer 18, a copper layer 20, and a titanium layer 22 sandwich is used. The bottom titanium layer 22 is used as an adhesion layer for the pre-plate copper layer 20 and the top titanium layer 18 is used as a protective coat to prevent the copper layer 20 from oxidizing after deposition. For example only, the titanium layer 18 may be 500 angstroms thick, the copper layer 20 may be 2500 angstroms thick and the titanium layer 22 may be 500 angstroms thick. Other suitable electrically conductive layers 24 may consist of chromium/copper/chromium sandwiched layers. Alternatively, electrically conductive layer 24 can be electrolessly deposited onto substrate 10. For instance, layer 24 can comprise electrolessly deposited copper, nickel, a nickel alloy, or a combination thereof, having a thickness of 500–10,000 angstroms, wherein the preferred thickness is 1,000 angstroms.

Figure 3:
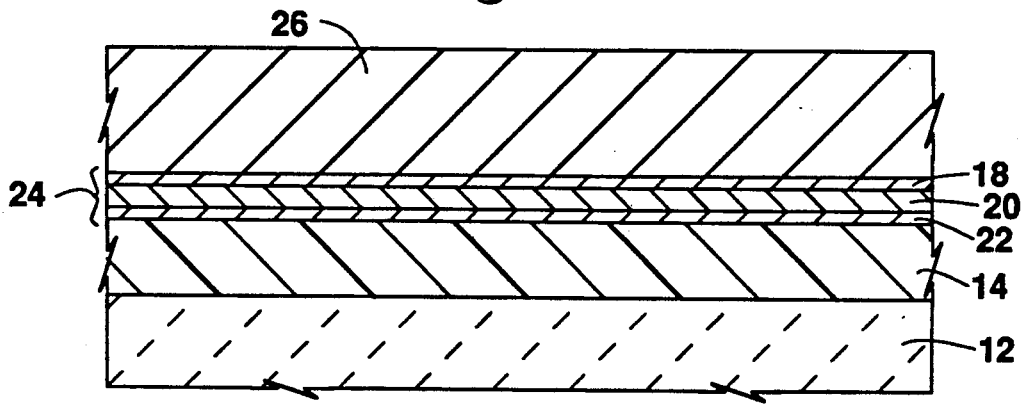

Referring now to FIG. 3, a copper base plating mask, such as photoresist 26, is formed on electrically conductive layer 24.

Figure 4:
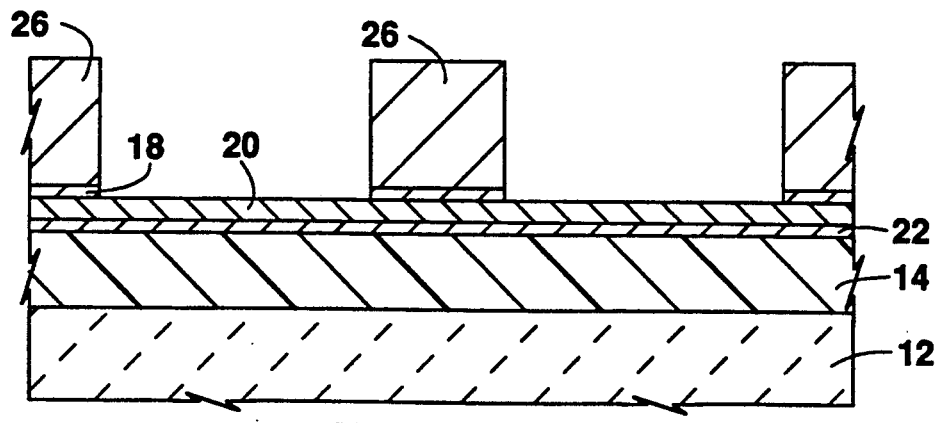

Referring now to FIG. 4, the photoresist 26 can be patterned through standard lithographic methods to provide selected openings therein for pattern plating a copper base. If desired, photoresist 26 can also be patterned for plating an electrical conductor such as a reference plane, x-line or y-line. It is also noted in FIG. 4 that the top titanium layer 18 was stripped in a mild solution, such as 0.5% hydrofluoric acid solution, thereby forming a pattern for a copper conductor to be plated to the copper layer 20.

Figure 5:
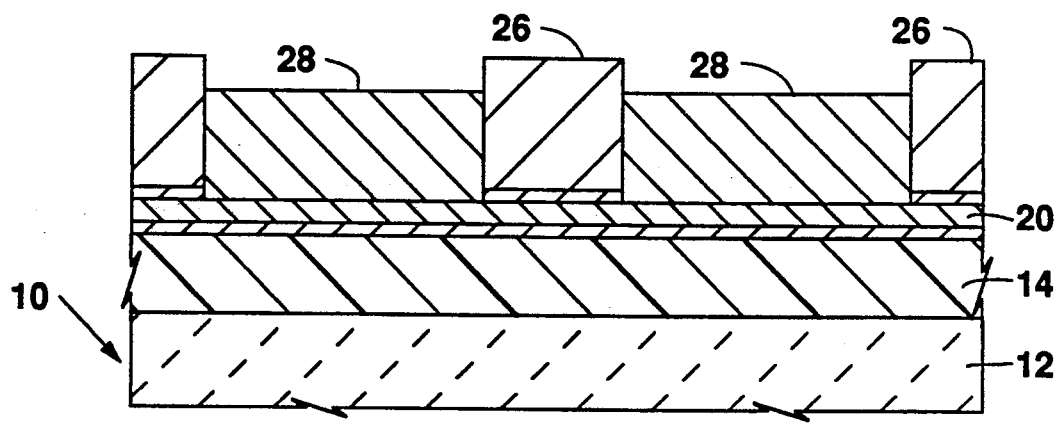

Referring now to FIG. 5, copper base 28, for example a reference plane, is plated to the copper layer 20 in the patterned openings formed by the photoresist 26. The copper base 28 can be plated by any suitable method, including electroplating and electroless deposition. For illustration only, copper base 28 can be 5 $\mu$m high.

Figure 6:
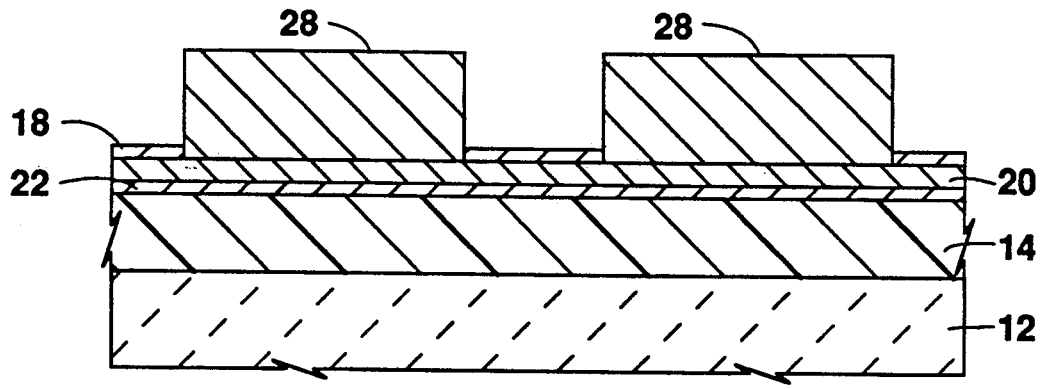

Referring now to FIG. 6, the photoresist 26 has been stripped as is conventional.

Figure 7:
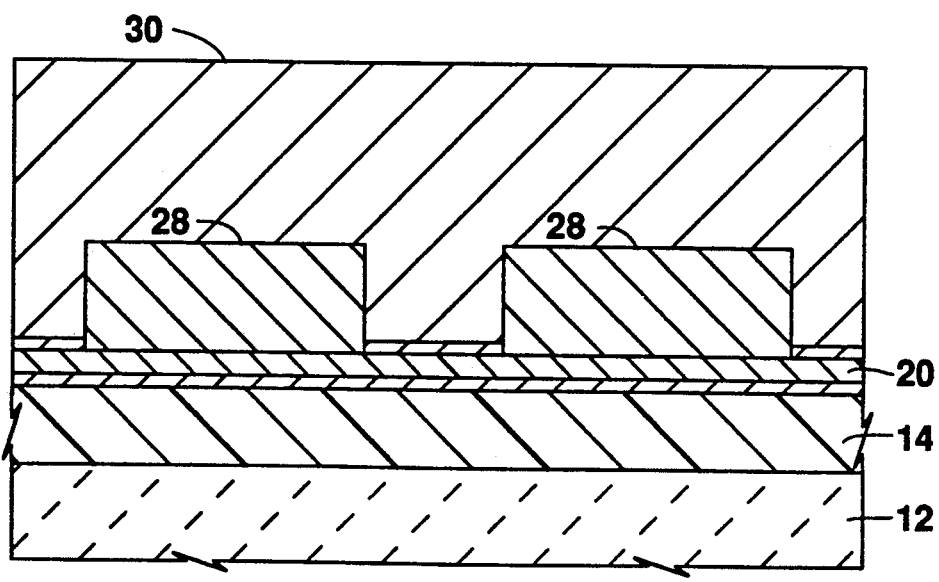

Referring now to FIG. 7, a pillar plating mask shown as a thick layer of photoresist 30 is formed on top of copper base 28.

Figure 8:
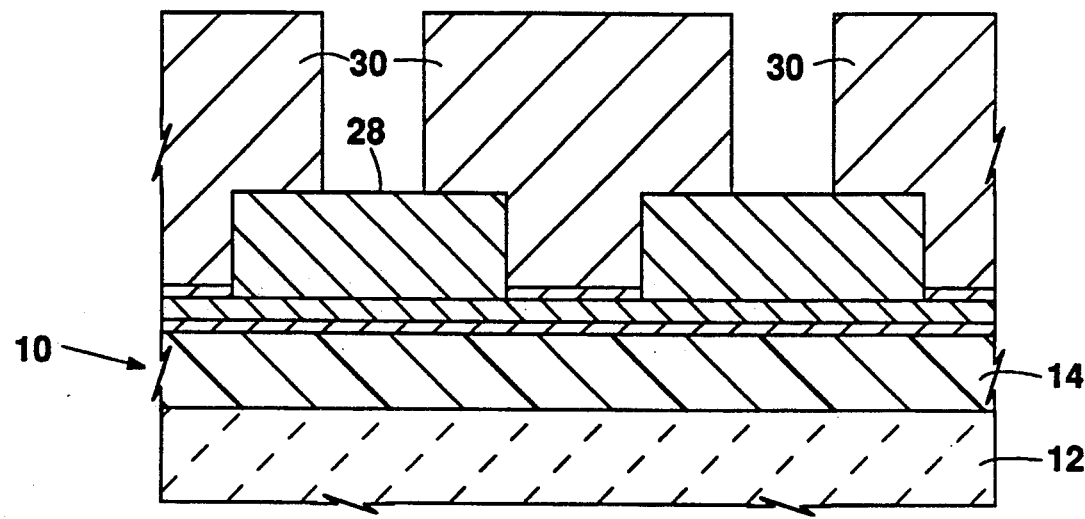

Referring now to FIG. 8, the photoresist 30 is patterned as is conventional to form patterns for plating a pillar or via onto the copper base 28.

Figure 9:
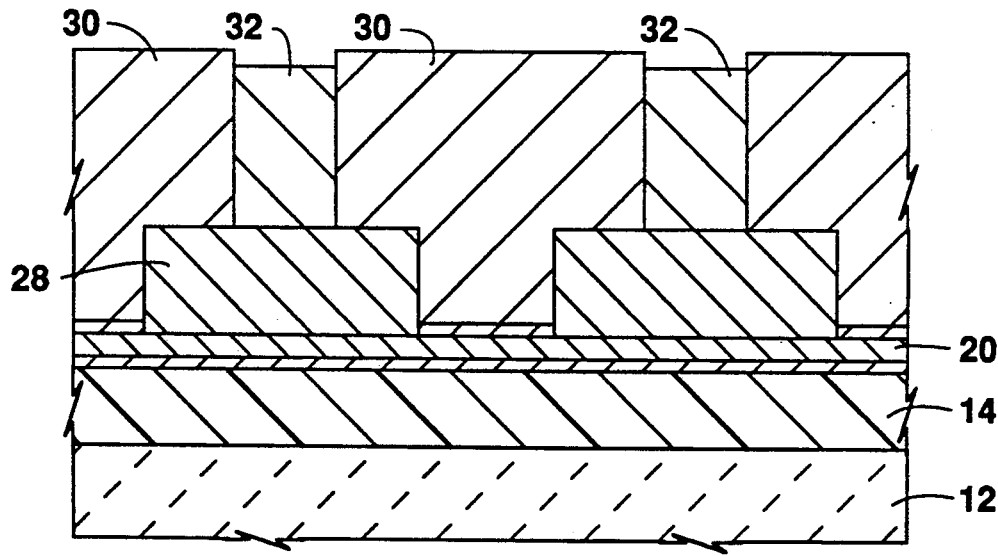

Referring now to FIG. 9, electrically conductive metal pillar 32 is plated into an opening in photoresist 30 onto the top of copper base 28. The pillar 32 can be plated by any suitable method, including electroplating and electroless deposition. Suitable metals for pillar 32 include copper nickel, and nickel alloys. For illustration only, metal pillar 32 can be 5 $\mu$m to 25 $\mu$m high.

Figure 10:
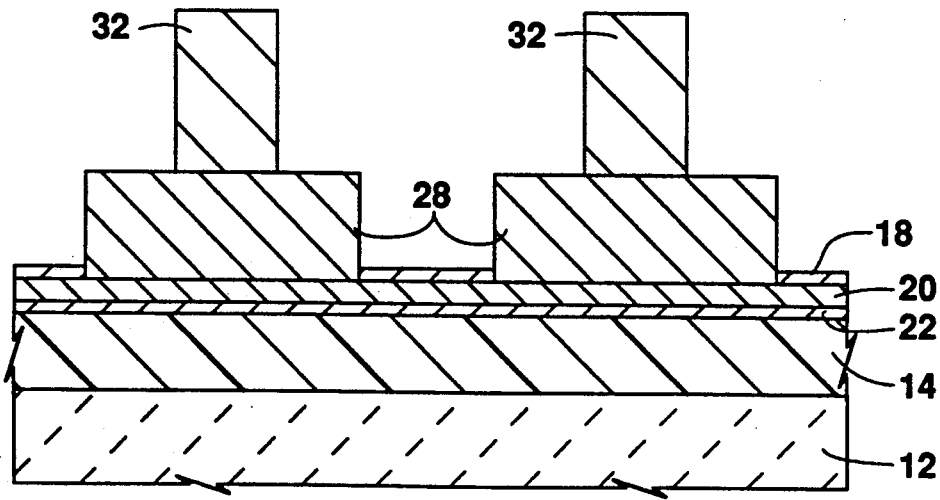

Referring now to FIG. 10, the photoresist 30 used as a pillar plating mask has been stripped as is conventional leaving pillar 32 securely attached to copper base 28 with the surfaces exposed.

Figure 11:
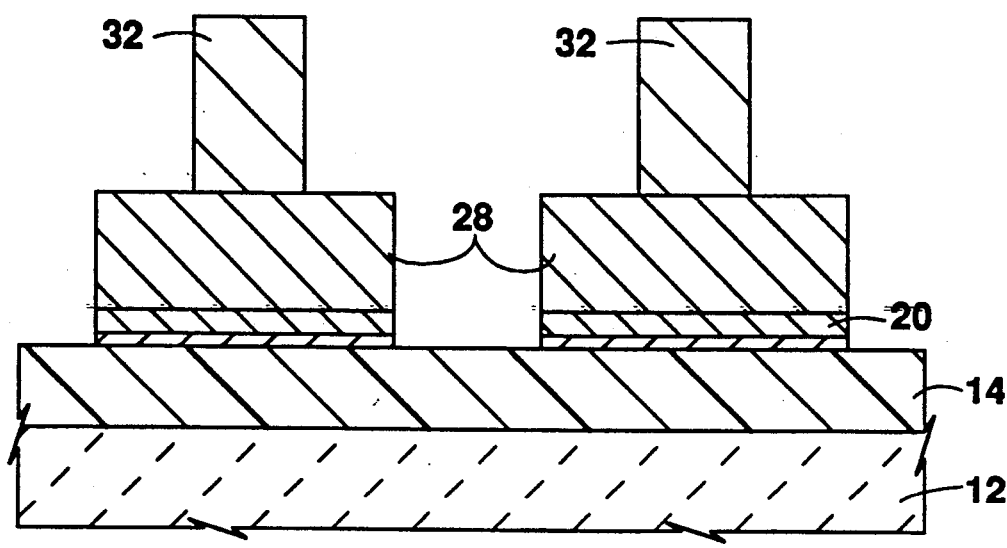

Referring now to FIG. 11, the electrically conductive layer 24 below the stripped base plating mask 26 is stripped. It is seen that titanium 18, copper 20 and titanium 22 are stripped to disconnect connections between adjacent copper bases 28.

It has been noted that in copper/polyimide interconnects the copper which is in contact with polyimide will discolor indicating its oxidation or corrosion. This oxidation frequently results in some amount of delamination. Therefore, to enhance the reliability of the interconnect an overcoat can be provided to protect the copper from oxidation and corrosion and to enhance the adhesion of polyimide to copper. An overcoat layer may be similarly advantageous for other interconnect metals as well. Thus, if desired, the structure shown in FIG. 11 can have a protective overcoat layer deposited on the exposed surfaces, which include the exposed top surface and side walls, of the copper base 28 and metal pillar 32. Alternatively, if metal pillar 32 is not copper then the overcoat material can be deposited only on the exposed copper surfaces of copper base 28. The overcoat can be deposited by any suitable method, including immersion coating and electroless deposition. If the overcoat is immersion coated, the overcoat material can be tin, or any other material that can be immersion coated. If the overcoat is electrolessly deposited, the overcoat material can be chromium, nickel, a nickel alloy, or any other material that can be electrolessly deposited.

If desired, a light copper etch can be applied to the exposed copper surfaces prior to depositing the protective overcoat so that any copper oxide that has formed will be removed. Any suitable copper etchant can be used, such as ammonium persulfate/phosphoric acid solution. The copper etch may etch back a small amount of copper, for instance 1,000 angstroms, but this should have no significant effect on the performance of the remaining copper structure.

Figure 12:
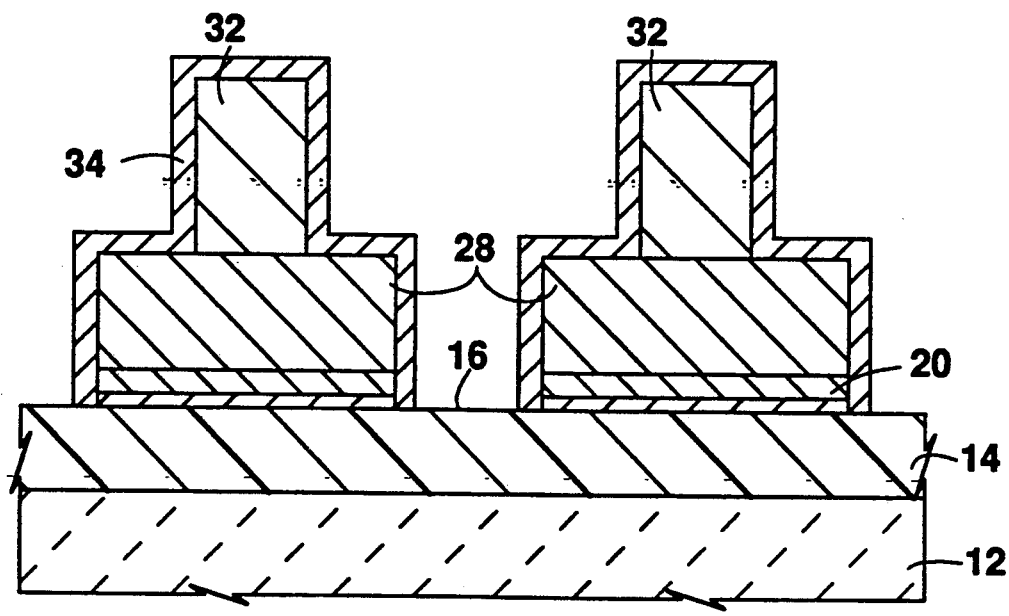

Referring now to FIG. 12, a protective overcoat 34, such as 5,000 angstroms of nickel, may be plated on all the exposed surfaces of metal pillar 32 and copper base 28.

Figure 13:
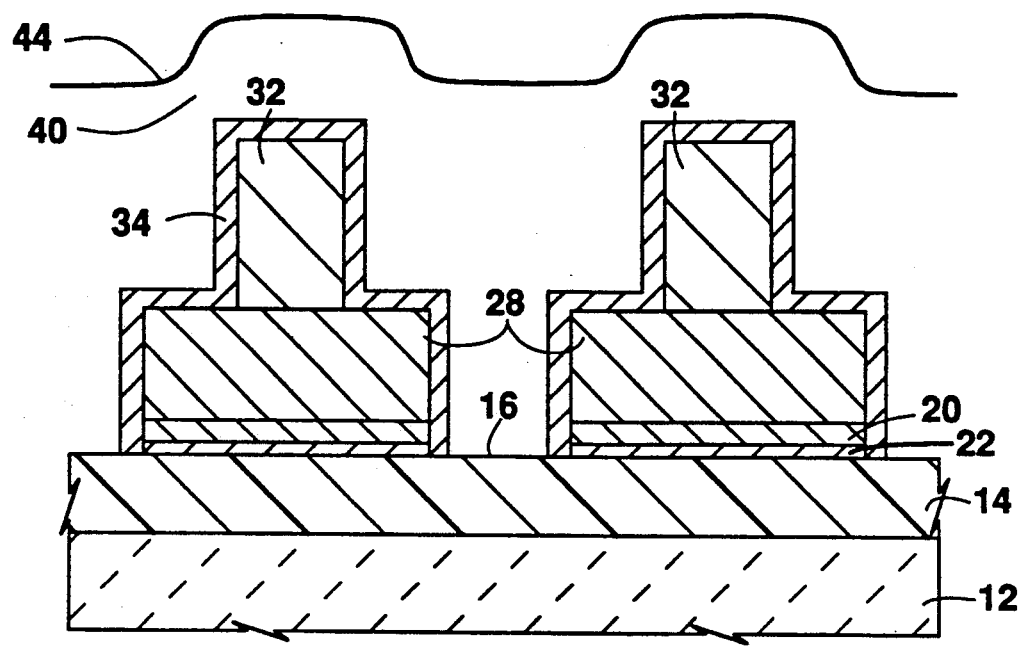

Referring now to FIG. 13, if desired, the structure shown in FIG. 12 can have a polymeric dielectric such as polyimide coated over the reworked metallization. Polyimide enclosure 40 can be applied by any conventional method, such as spin coating, spray coating, or laminating a pre-preg. The non-uniformity of metal pillars 32 over surface 16 is likely to result in the top surface 44 of polyimide enclosure 40 exhibiting non-planarity. For illustration only, to assure that metal pillars 32 are fully enclosed, top surface 44 of polyimide enclosure 40 should be at least 3 $\mu$m above the tops of metal pillars 32.

Figure 14:
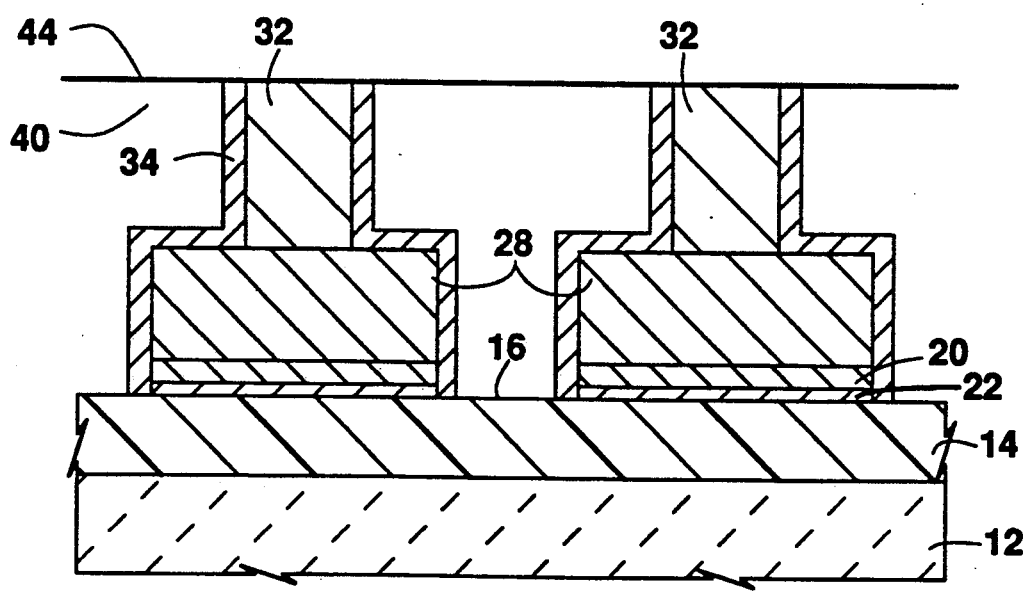

Referring now to FIG. 14, top surface 44 of polyimide enclosure 40 will normally be planarized with the tops of metal pillars 32 exposed prior to additional processing steps. During polishing, nickel overcoat 34 is likely to be removed from the tops of metal pillars 32 since polyimide 40 must be completely removed from the tops of metal pillars 32 to assure a reliable contact with the next layer and, in practice, it is nearly impossible to prevent the removal of nickel overcoat 34 from the tops of metal pillars 32 as polishing occurs. The polishing previously described to remove defective metallization layer 1 is suitable for planarizing top surface 44 and metal pillars 32.

Figure 15:
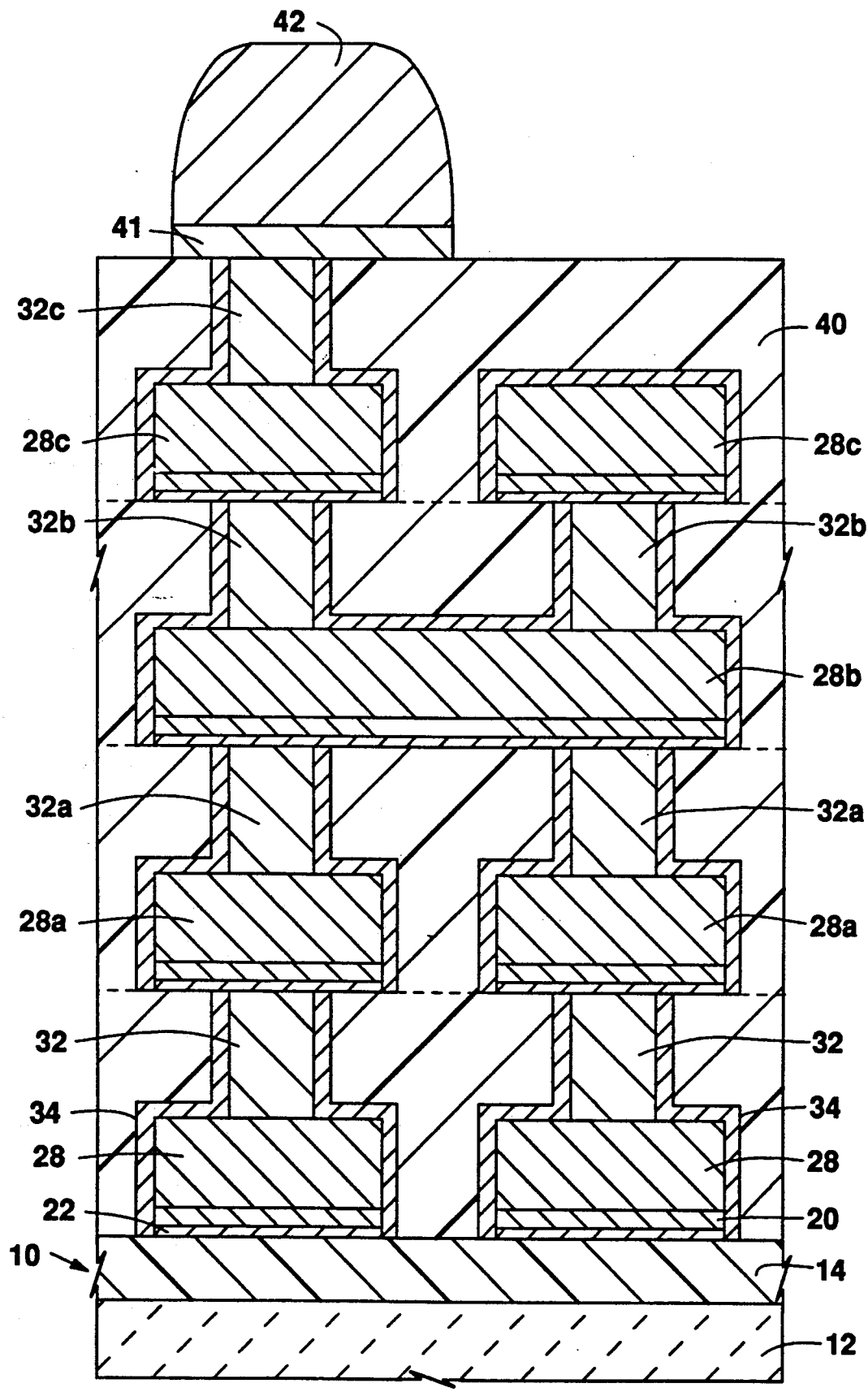

Referring now to FIG. 15, if desired additional levels of conductors and reference planes can be fabricated by repeating the above-described sequence of operations beginning after removal of the defective metallization layer. In the example given in FIG. 15, copper bases 28a can be x-lines, copper bases 28b can be y-lines, and copper base 28c is an additional reference plane with interconnecting pillars 32a, 32b, and 32c, all enclosed in a polyimide enclosure 40. Thus, the process sequence described in this invention after removal of the defective metallization layer can be repeated to fabricate a high-density multilayer interconnect. On top of the multilayer interconnect bonding pads 42 and barrier/adhesion layer 41 can be fabricated as is conventional to form bonding pad for component bonding to the interconnect.

If any of the new layers are found to be defective then they can be reworked in accordance with the present invention. Alternatively, if the reworked metallization defects are discovered prior to applying the polyimide enclosure, then several additional repair techniques may be advantageous. For instance, short-circuited connections can be severed by a laser beam or an ion beam, and opened segments can be connected by laser deposition, laser chemical vapor deposition, chemical vapor deposition, or ink jet metal deposition.

A nickel alloy is described herein as suitable for electrically conductive layer 24, electrically conductive metal pillar 32, and protective overcoat 34. Acceptable compositions of these nickel alloys will be well known to those having skill in the art. By way of example, suitable nickel alloys include nickel-phosphor, nickel-tungsten, nickel-platium, and nickel-chromium.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What is claimed is:

1. A method of reworking an electrical multilayer interconnect comprising:
   removing a defective metallization layer from the top of an interconnect substrate,
   depositing an electrically conductive layer on the substrate,
   forming a base plating mask on the electrically conductive layer,
   plating a copper base into an opening in the base plating mask onto the electrically conductive layer,
   stripping the base plating mask,
   forming a pillar plating mask on top of the copper base,
   plating an electrically conductive metal pillar into an opening in the pillar plating mask onto the top of the copper base,
   stripping the pillar plating mask, and
   stripping the electrically conductive layer below the stripped base plating mask.

2. The method of claim 1 wherein the electrically conductive layer is a metal.

3. The method of claim 2 wherein the electrically conductive metal layer is sputter deposited.

4. The method of claim 2 wherein the electrically conductive metal layer is electrolessly deposited.

5. The method of claim 1 wherein the electrically conductive metal pillar is plated by electroless deposition.

6. The method of claim 1 wherein the electrically conductive metal pillar is plated by electroplating.

7. The method of claim 1 wherein the electrically conductive metal pillar is selected from the group consisting of copper, nickel, and a nickel alloy.

8. The method of claim 1 further comprising the step of depositing an overcoat layer on the exposed copper surfaces.

9. The method of claim 8 wherein the overcoat layer is deposited on the exposed surfaces of the copper base and electrically conductive metal pillar.

10. The method of claim 8 wherein the overcoat layer is electrolessly deposited.

11. The method of claim 10 wherein the overcoat layer is an electrolessly deposited metal selected from the group consisting of chromium, nickel, and a nickel alloy.

12. The method of claim 8 wherein the overcoat layer is immersion coated.

13. The method of claim 12 wherein the overcoat layer is immersion coated tin.

14. The method of claim 8 wherein prior to depositing the overcoat layer a light copper etch is applied to the exposed copper surfaces.

15. The method of claim 1 wherein the defective metallization layer is removed by uniform and non-selective polishing.

16. The method of claim 15 wherein the polishing is done by a rotating pad with a slurry.

17. The method of claim 1 further including depositing a polyimide coating over the substrate after stripping the electrically conductive layer.

18. A method of reworking an electrical multilayer interconnect comprising:
   removing a defective metallization layer from the top of an interconnect substrate,
   depositing an electrically conductive metal layer on the substrate,
   forming a base plating mask on the metal layer,
   plating a copper base into an opening in the base plating mask onto the metal layer,
   stripping the base plating mask,
   forming a pillar plating mask on top of the copper base,
   plating a pillar selected from the group consisting copper, nickel, and a nickel alloy into an opening in the pillar plating mask onto the top of the copper base,
   stripping the pillar plating mask, and
   stripping the metal layer below the stripped base plating mask.

19. The method of claim 18 further comprising the step of depositing an overcoat layer on the exposed copper surfaces.

20. The method of claim 19 wherein the overcoat layer is electrolessly deposited.

21. The method of claim 19 wherein the overcoat layer is immersion coated.

22. The method of claim 18 wherein the defective metallization layer is removed by uniform and non-selective polishing.

23. The method of claim 22 wherein the polishing is done by a rotating pad with a slurry.

24. The method of claim 18 further including depositing a polyimide coating over the substrate after stripping the metal layer.

* * * * *

UNITED STATES PATENT AND TRADEMARK OFFICE
CERTIFICATE OF CORRECTION

PATENT NO. : 5,011,580

DATED : 4/30/91

INVENTOR(S) : Pan et al

It is certified that error appears in the above-identified patent and that said Letters Patent is hereby corrected as shown below:

Column 6, line 62, after "consisting" insert --of--.

Signed and Sealed this

Twentieth Day of October, 1992

Attest:

DOUGLAS B. COMER

Attesting Officer      Acting Commissioner of Patents and Trademarks